United States Patent [19]

Nagalingam et al.

[11] Patent Number: 5,344,787
[45] Date of Patent: Sep. 6, 1994

[54] LATID IMPLANTS FOR INCREASING THE EFFECTIVE WIDTH OF TRANSISTOR ELEMENTS IN A SEMICONDUCTOR DEVICE

[75] Inventors: Samuel J. S. Nagalingam, Los Gatos, Calif.; Yu P. Han, Dallas; Ravi Jhota, San Antonio, both of Tex.

[73] Assignee: VLSI Technology, Inc., San Jose, Calif.

[21] Appl. No.: 126,626

[22] Filed: Sep. 24, 1993

[51] Int. Cl.$^5$ .................................... H01L 21/265
[52] U.S. Cl. ................................. 437/35; 437/70
[58] Field of Search ......................... 437/35, 70

[56] References Cited

U.S. PATENT DOCUMENTS

| | | | |
|---|---|---|---|
| 3,873,371 | 3/1975 | Wolf | 148/1.5 |
| 4,013,484 | 3/1977 | Boleky et al. | 437/70 |
| 4,023,195 | 5/1977 | Richman | 437/70 |
| 4,027,380 | 6/1977 | Deal et al. | 437/70 |
| 4,178,191 | 12/1979 | Flatley | 437/70 |
| 4,253,229 | 3/1981 | Yeh et al. | 437/39 |
| 4,417,385 | 11/1983 | Temple | 29/571 |
| 4,466,178 | 8/1984 | Soclof | 29/576 B |
| 4,554,726 | 11/1985 | Hillcnius et al. | 148/53 |
| 4,698,899 | 10/1987 | Kakihana | 437/44 |
| 5,045,898 | 9/1991 | Chen et al. | 357/23.11 |
| 5,100,810 | 3/1992 | Yoshimi et al. | 437/21 |
| 5,173,438 | 12/1992 | Sandhu | 437/63 |
| 5,240,874 | 8/1993 | Roberts | 437/69 |

FOREIGN PATENT DOCUMENTS 0006152 2/1981 Japan ..................................... 437/39

OTHER PUBLICATIONS

S. Wolfe, "Ion Implantation for VLSI", *Silicon Processing for the VLSI Era*, pp. 306–311.

Primary Examiner—Tom Thomas
Assistant Examiner—Lynne A. Gurley
Attorney, Agent, or Firm—Burns, Doane, Swecker & Mathis

[57] ABSTRACT

The diffusion of P-type channel-stop implants into regions where P-type channels are to be formed which will connect N-type source and drain regions of a transistor element on a P-type substrate is effectively compensated for through angled implantation of an N-type dopant material into these regions. Angle implantation is performed by tilting and rotating the wafer in the presence of an N-type ion beam.

8 Claims, 3 Drawing Sheets

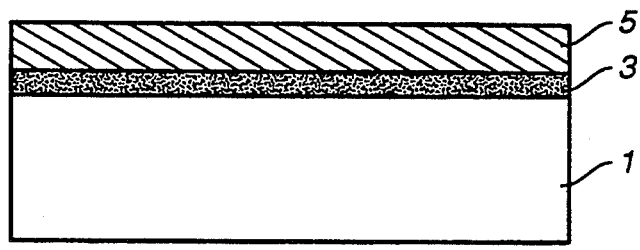
FIG._1
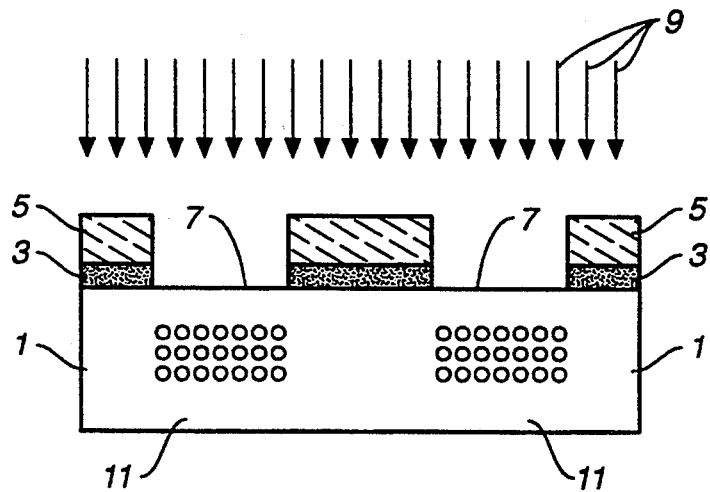
FIG._2
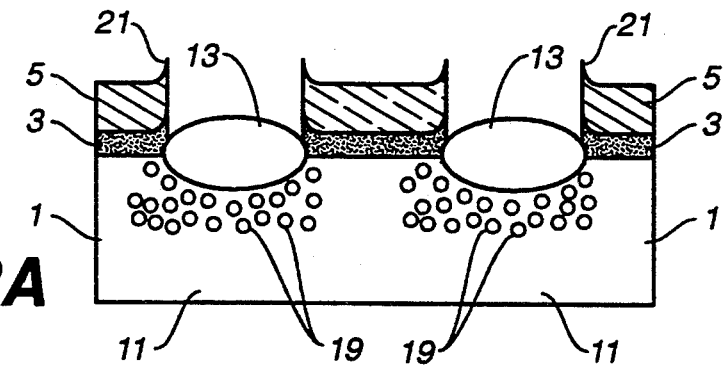
FIG._3A

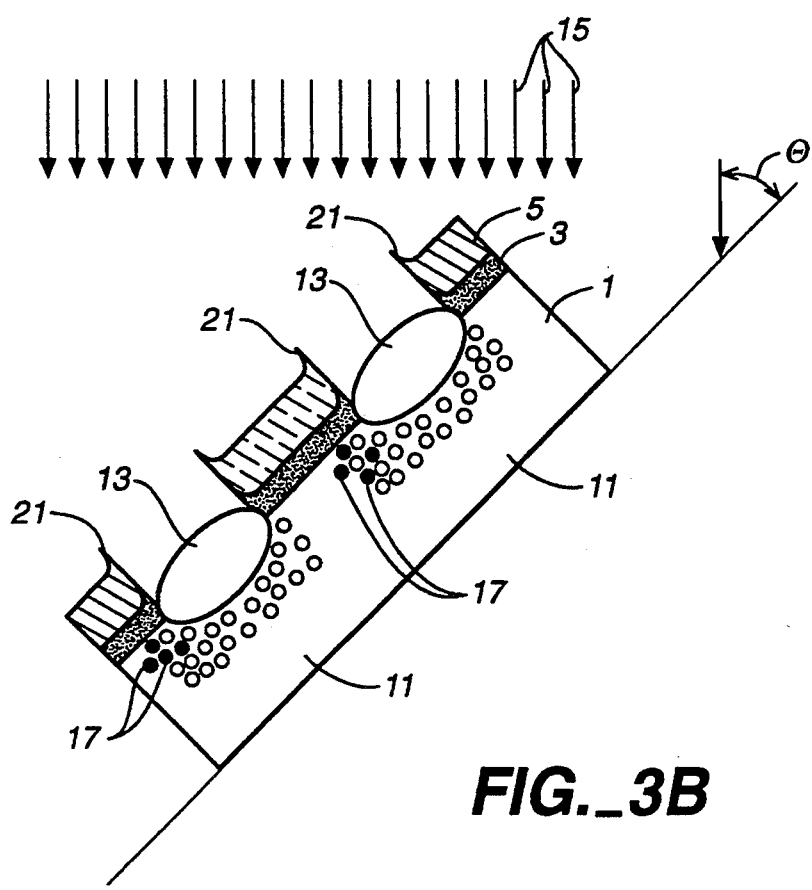
FIG._3B

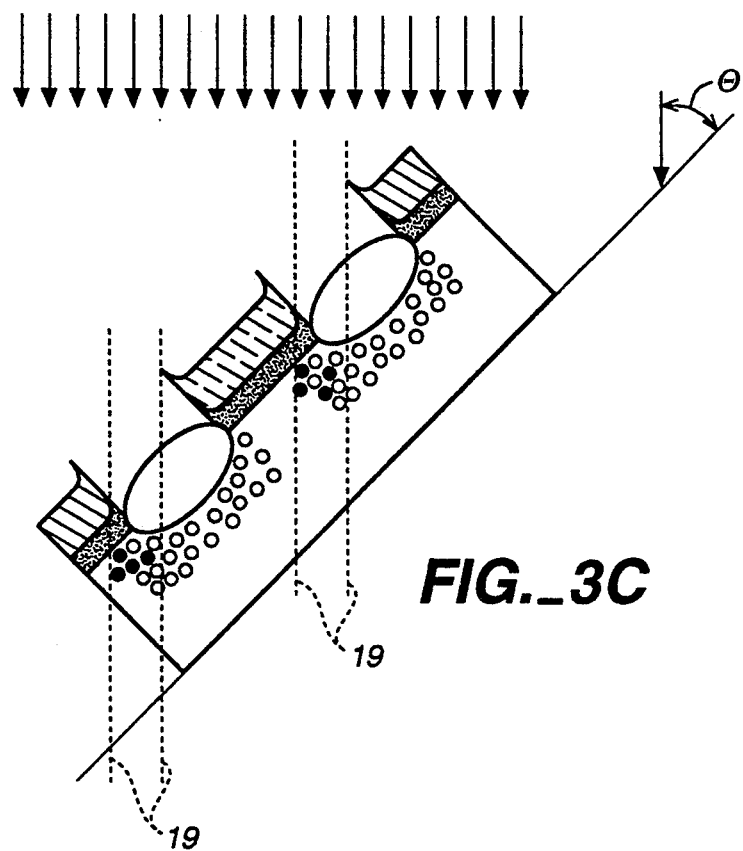
FIG._3C
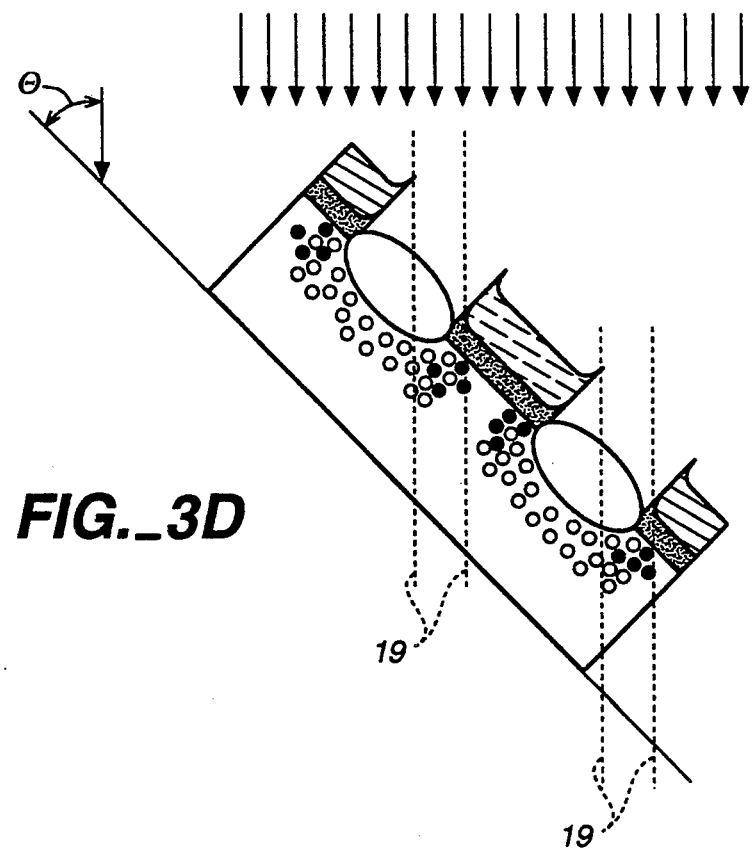
FIG._3D

LATID IMPLANTS FOR INCREASING THE EFFECTIVE WIDTH OF TRANSISTOR ELEMENTS IN A SEMICONDUCTOR DEVICE

BACKGROUND OF THE INVENTION

1. Field of the Invention

This invention relates generally to the fabrication of improved semiconductor devices and more particularly to a method of increasing the effective width of P-type channels connecting N-type source and drain regions of transistor elements separated from other transistor elements in the semiconductor device by field oxide regions and P-type channel stop implants.

2. State of the Art

During field oxidation, P-type channel-stop implants (e.g., boron) in P-type substrates typically experience undesired segregation and oxidation-enhanced diffusion. Specifically, during field oxidation, the P-type channel-stop implant preferentially segregates into the field oxide layer resulting in a reduction in concentration of the implant in the silicon at the field oxide/silicon interface. Also, during field oxidation, the P-type channel-stop implant also diffuses into areas where transistor elements bordering the field oxide regions including the P-type channel connecting the N-type source and drain regions of a transistor element are to be formed.

A reduction in the P-type channel-stop implant concentration at the field oxide/silicon interface enhances the possibility of undesired inversion under the field oxide and, accordingly, it is common practice to effect a second doping of the P-type channel-stop implant to increase the concentration of this implant at this interface. However, relatively high doses of channel-stop implants are needed in order for acceptable field threshold voltages to be achieved. This also implies that the peak of the channel-stop implant must be deep enough that it is not absorbed by the growing field-oxide interface. On the other hand, if the channel-stop doping is too heavy, it will cause high source/drain-to-substrate capacitances and will reduce source/drain-to-substrate pn junction breakdown voltages.

The lateral diffusion of the P-type dopant in the channel-stop implants also causes the P-type dopant to encroach or diffuse into areas where transistor elements are to be formed and which elements are to be segregated from each other on the semiconductor device by field oxide regions and channel-stop implants. Such encroachment includes diffusion into the area where the channel under the gate which connects the N-type source and drain regions of a transistor element is to be formed. Diffusion of the P-type dopant into the edges of these to-be-formed transistor elements contacting the field oxide, including the edges of the channel tinder the gate which connect N-type source and drain regions, will increase the threshold voltage at the channel edges resulting in a threshold voltage ($V_{The}$) higher at these edges as compared to the threshold voltage ($V_{The}$) in the center portions of the channel. As a result, the edges of these channels under the gate will conduct much less current than the interior portions, and the channel element will behave as if it was more narrowly constructed. The effect is also enhanced when the dose of the channel-stop implant is increased.

There have been several attempts to resolve the above-identified problems. For example, it has been reported that the extent of the channel-stop implant diffusion can be reduced by using high pressure oxidation (HIPOX) to grow the field oxide, by using germanium-boron co-implants, or by using chlorine implants. HIPOX allows the oxide-growth temperature to be reduced, which reduces the diffusion length of the implant. The germanium-boron co-implants exploit the fact that boron diffuses with a lower diffusivity in the presence of implanted germanium, and boron segregation effects are also reduced. The chlorine implant is performed in the field regions prior to field oxidation, and this causes the oxide to grow at a faster rate. Consequently, the field oxide can be grown in less time at the same temperature thereby reducing boron diffusion.

Another method is identified in U.S. Pat. No. 4,554,726. In this patent, a photoresist is patterned to expose portions of the substrate for the N-type type tubs. Phosphorus and arsenic are implanted followed by photoresist stripping and oxidation of the N-type tub surface. Boron is then implanted for the P-type tub, and the oxide stripped. A dopant drive-in heating step is then accomplished to drive the dopants deeper into the semiconductor substrate, thereby forming the N-type and P-type tubs. A second boron implant into the P-type tubs is performed. A subsequent lithography step then defines an opening in the masking layer at the boundary between the N-type and P-type tubs. An oxidation step follows, to form the "field oxide" region, which isolates the N-type tubs from the P-type tubs at the surface of the substrate. The second boron implant then forms the "channel stop" region under the field oxide in the P-type tub, which aids in isolating the N-channel devices to be formed therein. In order to retain the second boron implant near the oxide/silicon interface, the field oxide is formed during a relatively brief oxidation process that is accomplished in steam at high pressure.

This problem has also been addressed in U.S. Pat. No. 5,045,898. This patent relates to a CMOS integrated circuit having a P-type region and an N-type region. In particular, this patent implants a boron channel-stop at a depth at least as great as the depth of the field oxide in the silicon substrate. In other words, the boron channel-stop implant has an energy selected so that the boron concentration is just below the subsequently formed field oxide.

However, although the above solutions have achieved a measure of success, additional methods must be employed to inhibit reduction in the effective width of P-type channels connecting N-type source and drain regions of transistor elements in semiconductor devices if further successful miniaturization of integrated circuits is to be achieved.

SUMMARY OF THE INVENTION

This invention is directed, in part, to a method for increasing the effective width of the channel under the gate of a transistor element which channel connects N-type source and drain regions on a P-type substrate.

Specifically, the methods of this invention are directed to methods for increasing the effective width of a P-type channel connecting N-type source and drain regions of a transistor element located on the surface of a P-type substrate which element is separated from other transistor elements on the substrate by field oxide and P-type channel-stop implants. In the methods of this invention, the substrate is treated prior to formation of the transistor elements to effectively counter the effect of P-dopant migration during formation of channel-stop implants and field oxide regions on the substrate. The methods of this invention comprise the steps of:

(a) tilting a transistor-free substrate having P-type field stop implants and field oxide regions which substrate contains a silicon nitride layer over all portions of the substrate surface except over the field oxide regions wherein said substrate is tilted at an angle of from greater than 0° to less than 90° relative to the direction of an N-type ion beam;

(b) ion-implanting N-type ion dopant into the tilted substrate;

(c) rotating the substrate while retaining or later reestablishing the tilt and repeating step (b) until all of the substrate has been exposed to ion-implantation;

(d) thermally treating the substrate produced in step (c) above so as to activate the dopants; and (e) completing fabrication of said transistor element on the surface of said substrate wherein sufficient N-type dopant is implanted into the substrate so that the threshold voltage in the boundary of the P-type channel of said transistor element is reduced.

In a preferred embodiment, the N-type ion dopant used in step (b) is phosphorus. More preferably, the to-be-formed N-type source and drain regions will be doped with phosphorus and the dopant used in the P-type channel-stop implants and with the P-type channel is boron.

In another preferred embodiment, the threshold voltage in the P-type channel under the area adjacent to the gate boundary in devices treated by the methods described herein is reduced such that the ratio of the threshold voltage at the channel boundary to the threshold voltage at the channel center is less than 1.5:1.

In still another preferred embodiment, the wafer is rotated 4 times (e.g., 90° for each rotation in the case of a circular wafer) during angle implantation.

Still, more preferably, the angle of implantation is from about 30° to 60° relative to the direction of an N-type ion beam. Even more preferably, the angle of implantation can be altered during implantation to effect implantation over a greater area. For example, angle implantation can be conducted at 30°, 40°, 50°, and 60° by merely adjusting the tilt of the wafer during implantation in step (b).

This invention is also directed, in part, to a semiconductor device having an increased effective P-type channel width which is prepared by the above-described methods.

BRIEF DESCRIPTION OF THE DRAWINGS

FIGS. 1, 2, 3A and 3B represent cross-sectional views of a portion of a semiconductor device showing various stages of processing according to the methods of this invention.

FIGS. 3C and 3D illustrate the effected zones of ion implantation in a substrate tilted at an angle θ.

DETAILED DESCRIPTION OF THE PREFERRED EMBODIMENTS

FIG. 1 illustrates a portion of a semiconductor device in accordance with the present invention. Except where specific processing is employed to carry out the purposes of the present invention, the semiconductor device is processed according to conventional methods.

As illustrated in FIG. 1, a semiconductor substrate 1 is provided and is appropriately doped with a P-type dopant. A buffer oxide layer 3, e.g., silicon dioxide, is provided on the surface of the substrate material and a masking layer 5, e.g., silicon nitride, is then provided on the surface of the buffer oxide layer 3. In one preferred embodiment, the buffer oxide layer 3 is about 50 to 600 Å in depth and more preferably about 400 Å in depth; whereas the silicon nitride layer 5 is preferably about 1000 to 2000 Å in depth and more preferably about 1500 Å in depth.

As can be seen in Figure 2, the silicon nitride layer 5 and buffer oxide layer 3 are patterned to expose selected portions 7 of the substrate for subsequent implantation of a P-type dopant material 9, e.g., boron, which is selectively implanted through the exposed portions 7 of the mask into the semiconductor substrate.

The P-type dopant material 9 may be implanted into portions 7 by any appropriate method. The implanted dopant material forming the channel-stop implants are illustrated by the open circles 11 in the substrate material. The ion implantation energy for the P-type dopant material is sufficient to implant the dopant material into the semiconductor substrate to an average level at least equal to the level to which the substrate will be subsequently oxidized. The dopant distribution within the substrate is generally uniform. Additionally, the density and depth of the implanted dopant material is a function of the current and energy of the ion beam. The specific current and energy of the ion beam is dependent on factors such as the desired concentration of P-type ion in the substrate, the desired depth of P-type ion-implantation and the like. For example, in a preferred embodiment, the concentration of P-type dopant in the channel-stop implant is about 100 or more times greater than in the substrate. In a particularly preferred embodiment, the P-type dopant such as boron is implanted at a voltage of approximately 200 KeV to a depth of about 0.2 to about 0.6 microns to form a channel-stop implant.

By the term "selectively implanting a substrate material with a P-type dopant material" it is understood that the substrate material is treated so as to allow for the implantation of a P-type dopant material into selective portions of the substrate where increased concentrations of the dopant material are desired. For example, a masking material having a first etch rate, e.g., silicon nitride, may be deposited on the exposed tapper surface of the substrate material or a buffer oxide deposited on the substrate material. Then the masking material, and optionally the buffer oxide, are patterned to expose certain portions of the substrate for implantation of a P-type dopant material to form channel-stop implants therein. Thus, when the dopant material is implanted into the substrate, the masking material effectively masks various portions of the substrate so that the dopant material is implanted only into those areas which are not protected by the masking material.

The average concentration of the P-type dopant material in the channel-stop implant region typically ranges from about 100 to about 10,000 times the concentration of the P-type dopant throughout the remainder of the substrate. It is preferred, however, that the average concentration of the P-type dopant material in the channel-stop implant ranges from about 500 to about 5,000, and more preferably from about 750 to about 2,500 times the concentration of the dopant material in the remainder of the substrate. In another preferred embodiment, the average concentration or dose of the P-type dopant material forming the channel-stop implants ranges from about $10^{11}$ to about $10^{15}$, and more preferably $10^{12}$ to about $10^{14}$ ions/cm$^2$.

It is recognized in the art that the dose ($\Phi$) of ion beams is related to the beam current I (in amperes), beam area A (in Cm$^2$), and the implantation duration t (in seconds) by the formula $$\phi = \frac{It}{q_i A}$$

where $q_i$ is the charge per ion. It is also recognized by the art that the depth to which the ions penentrate into the substrate is related to the energy of the ion beam. In view of the above, one skilled in the art would merely select the appropriate values for each of the above variables in order to achieve the requisite dose and depth discussed above. Such factors are well within the skill of the art.

In a preferred embodiment, the implant current employed is from about 1 milliampere to about 10 milliamperes, the duration is sufficient to provide the desired dose of ions at the current employed, the surface area is defined by the substrate and the energy of the ion beam is no more than about 200 KeV and more preferably from greater than about 50 KeV to about 200 KeV.

As illustrated in FIG. 3A, the semiconductor substrate 1 is then selectively oxidized so as to form field oxide 13 region in those areas exposed by the masking layer. By the term "selectively oxidizing the substrate material" it is understood that a field oxide is grown in only selective portions of the substrate material. For example, a masking material having a first etch rate, e.g., silicon nitride, and, optionally, a second material such as a buffer oxide may be patterned to expose certain portions of the substrate for purposes of oxidation. Thus, when the substrate is subjected to an oxidation treatment, the substrate oxidizes in only those areas not protected by the masking material. The oxidation typically takes place in the same region as the channel-stop implants.

By the term "in the same region as the channel-stop implants," it is understood that the field oxide is grown in the same areas of the substrate that were exposed for the implantation of the first-type dopant material. In this way, the field oxide is grown more or less directly above the channel-stop implants.

The field oxide may be grown in accordance with conventional methods. It is preferred, however, that the field oxide is grown in a manner that limits or controls the extent of the segregation or diffusion of the P-type dopant in the channel-stop implants into the surrounding regions of the semiconductor substrate. For example, it is possible to grow the field oxide under HIPOX conditions, with or without the presence of steam. During such oxidation, the oxidized substrate exhibits growth due to the larger molecular weight of the formed SiO$_2$ layer as compared to the silicon layer prior to oxidation. In turn, this growth pushes the silicon nitride layers up in the areas 21 immediately above the growing silicon dioxide layer to form what is referred to in the art as "bird beaks". If desired, appropriate steps may also be taken at this point to reduce or compensate for the formation of the bird beaks at the silicon nitride/field oxide interface. For example, the field oxide may be subjected to an etch-back procedure to reduce the bird's beak effect, so that the field oxide thickness on the final device is only about ⅔ of the thickness as grown.

Notwithstanding the use of methods to inhibit migration of the P-type dopant 11 during formation of the field oxide, the dopant migrates during the formation of the field oxide 13 to regions bordering the field oxide 13 including the areas adjacent the border of the to-be-formed P-type channel which will connect the N-type source and drain regions. Such diffusion is detrimental to the operation of the completed transistor element and results in an increase in the threshold voltage in the boundary areas of the P-type channel. In turn, such increases in the threshold voltage at these boundaries result in a reduction in the effective width of the channel. Specifically, the effective width of a channel is that portion which is activated by application of a specified threshold voltage and, accordingly, a sufficient increase in the threshold voltage at the boundaries of the channel will result in these areas not being activated by an applied threshold voltage.

In order to counter the effect of P-type dopant migration into the areas below the boundaries of the gate, an N-type dopant material 15, e.g., phosphorus, is angled implanted, as shown in FIG. 3B, at angle $\theta$ into the edges 17 of the channel prior to construction of the transistor elements on the surface of the substrate. Angle implantation is effected by tilting the substrate so that the surface of the substrate is at an angle $\theta$, as shown in FIG. 3B, relative to the direction of N-type ion beam which is transmitted in substantially a straight line. The position of the as-implanted N-type dopant material is indicated by the filled-in circles at position 17 in FIG. 3B and is controlled by the angle used for angle implantation.

By the use of the term "angle implanting" it is understood that the N-type dopant is ion implanted at an angle other than perpendicular or parallel to the substrate material, i.e., between 0° and 90° from a line perpendicular to the surface of the substrate material, as indicated by the angle $\theta$ in FIG. 3B.

Although the present invention contemplates almost any dopant ion implant angle between 0° and 90°, it is preferred that the implant angle ranges from about 30° to about 60°, and more preferably between about 40° and about 50°. The precise implant angle should be selected so that the N-type dopant can be implanted into the to-be-formed channel boundary area below the gate which contains higher than desired concentrations of P-type dopant. For example, an N-type dopant material such as phosphorus may be implanted at an angle $\theta$ of about 45° from vertical so as to form a region of an N-type dopant implant in the to-be-formed channel area below the boundaries of the gate.

The preference for implantation at an angle of from about 30° to about 60° and more preferably at from about 40° to about 50° arises from the fact that, in this case, the majority of the ion beam not entering the desired location within the channel area is absorbed by silicon nitride layer 5 on either side of field oxide layer 13 thereby preventing unwanted exposure of the transistor elements to the ion beam. This effect is illustrated in FIGS. 3C and 3D which illustrate the effected zones of ion implantation defined by lines 19—19 which zones are relative to the angle of implantation and the height of the bird's beak.

Without being limited to any theory, it is believed that such implantation of the N-type dopant into the boundary areas of the to-be-formed channel counters the effect of excessive P-type dopant concentration in these areas and effectively lowers the threshold voltage in the boundary areas of the channel in the completed transistor element. In turn, a reduction in the threshold voltage in these regions has the net affect of enhancing the effective channel width in the transistor element.

In view of the above, ion implantation of the N-type dopant into the to-be-formed channel boundary regions is controlled so that the amount and depth of the implantation reduces the threshold voltage in these regions. Preferably, the threshold voltage is reduced to a level such that the ratio of the threshold voltage at the channel boundary to the threshold voltage in the center of the channel area is less than 1.5 and preferably from about 1 to about 1.5.

As noted above, it is recognized in the art that the dose ($\Phi$) of ion beams is related to the beam current I (in amperes), beam area A (in cm$^2$), and the implantation duration t (in seconds) by the formula $$\phi = \frac{It}{q_i A}$$

where $q_i$ is the charge per ion. It is also recognized by the art that the depth to which the ions penentrate into the substrate is related to the energy of the ion beam. In view of the above, one skilled in the art would merely select the appropriate values for each of the above variables in order to achieve the requisite dose and depth of N-type dopant as discussed above. Such factors are well within the skill of the art.

In a preferred embodiment, the current employed for angle implant of the N-type dopant ion is from about 1 milliampere to about 10 milliamperes, the duration is sufficient to provide the desired dose of ions at the current employed and the energy of the ion beam is no more than about 200 KeV and more preferably from greater than about 50 KeV to about 200 KeV.

Methods and equipment for conducting ion implantation are known in the art. See, for example, Wolf et al., Silicon Processing for the VLSI Era, Vol. 1, Process Technology, pp. 280–330, Lattice Press, Sunset Beach, Calif. (1986), which is incorporated herein by reference in its entirety.

Preferably, the dose of N-type dopant implanted into the channel boundary areas should be less than about $10^{16}$ atom/cm$^2$ and preferably less than about $10^{15}$ atoms/cm$^2$. In a particularly preferred embodiment of the present invention, the average concentration of the N-type dopant material at the boundary of the P-type channels connecting the N-type source and drain regions of a transistor element ranges from about $10^{11}$ to about $10^{14}$ atoms/cm$^2$.

Additionally, it is noted that while the N-type dopant material may be implanted prior to the formation of the field oxide, preferably angle implantation of this dopant material is performed subsequent to the growth of the field oxide.

As an additional step, the substrate containing the N-type and P-type dopant materials is thermally treated to activate the dopants. The thermal treating is conducted at a temperature sufficient to activate the dopants but not so high as to cause any substantial migration of the dopants which would adversely affect the performance of the semiconductor device. For example, the substrate may be annealed at a temperature less than about 1000° C. and preferably less than about 950° C. and more preferably from about 900° C. to about 1000° C. for a period of time from about 20 minutes to about 1 hour.

By employing the methods of the present invention described above, it is possible to prepare a semiconductor device with an increased effective P-type channel width connecting N-type source and drain regions as compared to similar devices which also contain P-type channel-stop implants but which do not contain the angled implants of the N-type dopant material at the edges thereof. It will also be appreciated by the skilled artisan that while the methods of the present invention have been described in relation to single well devices, the methods are equally applicable to twin-well devices, e.g., CMOS twin-well devices.

In order to further illustrate the present invention and the advantages thereof, the following specific examples are given, it being understood that the same are intended as illustrative and in no way limitative.

EXAMPLE

This example illustrates a method for angle implanting phosphorus ions (N-type dopant) in a partially fabricated semiconductor device. The partially fabricated semiconductor device is formed by conventional methods to provide a substrate surface similar to that shown in Figure 3A wherein the surface contains field oxide regions 13 and channel stop implants formed from P-type dopant 11. The stirface of the substrate contains a layer of silicon nitride 5 except over the field oxide regions 13 which terminate in bird's beaks 21 in the areas immediately adjacent to the field oxide regions 13. The silicon nitride layer is sufficient to retard ion beam penetration therethrough.

The substrate is then placed into a conventional ion beam apparatus and tilted at an angle of 45° as illustrated in FIG. 3B (angle $\theta$ in FIG. 3B equals 45° ). The pressure in the apparatus is reduced to about $5 \times 10^{-6}$ torr and a phosphorus ion beam of about 50 KeV is generated therein by a current of about 10 milliamperes. The phosphorus ion beam is directed onto the tilted substrate so as to permit ion implantation of phosphorus ions into effected zone defined by lines 19—19 in Figure 3C.

The substrate is then removed from the apparatus and is subjected to furance annealing in a vacuum of about 0.5 millitorr at a temperature of about 950° C. for a period of about 20 minutes to activate the implanted dopant.

The fabrication of transistor elements comprising conventional N-type source and drain regions, a P-type channel, and a gate is then conducted by conventional methods.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including the equivalence thereof.

What is claimed is:

1. A method for increasing the effective width of a P-type channel connecting N-type source and drain regions of a transistor element further comprising a gate which transistor element is located on the surface of a P-type substrate and is separated from other transistor elements on the substrate by field oxide and P-type channel-stop implants which method comprises the steps of:
  (a) tilting a transistor-free substrate having P-type field stop implants and field oxide regions which substrate contains a silicon nitride layer over all portions of the substrate surface except over the field oxide regions wherein said substrate is tilted at an angle of from greater than 0° to less than 90° relative to the direction of an N-type ion beam;
  (b) ion-implanting N-type ion dopant into the tilted substrate;
  (c) rotating the substrate while retaining or later reestablishing the tilt and repeating step (b) until all of the substrate has been exposed to ion-implantation;
  (d) thermally treating the substrate produced in step (c) above so as to activate the dopants; and
  (e) completing fabrication of said transistor element on the surface of said substrate
  wherein sufficient N-type dopant is implanted into the substrate so that the threshold voltage in the boundary of the P-type channel of said transistor element is reduced.

2. The method according to claim 1, wherein said P-type dopant material is boron and said N-type dopant material is phosphorus or arsenic.

3. The method according to claim 2, wherein the concentration of the N-type dopant material angle implanted is sufficient to reduce the threshold voltage at the boundary of the P-type channel such that the ratio of the threshold voltage at the channel boundary to the threshold voltage at the center of the channel is from 1:1 to no more than 1.5:1.

4. The method according to claim 1, wherein the temperature of the thermal anneal is less than about 1000° C..

5. The method according to claim 4, wherein said temperature is from about 900° C. to about 1000° C..

6. The method according to claim 1, wherein the N-type dopant material is implanted at an angle ranging from about 30° to about 60° relative to the direction of an N-type ion beam.

7. The method according to claim 6, wherein said angle ranges from about 40° to about 50°.

8. The method according to claim 6 wherein the ion implantation angle is adjusted during implantation.

* * * * *